United States Patent [19]

Ehling et al.

[11] 3,904,886

[45] Sept. 9, 1975

[54] VOLTAGE DISTRIBUTION SYSTEMS FOR INTEGRATED CIRCUITS

[75] Inventors: Theodore P. Ehling, Chester, N.J.; Alexander Plaza, Colchester, Vt.; Albert E. Ruehli, Peekskill, N.Y.

[73] Assignee: International Business Machines Corporation, Armonk, N.Y.

[22] Filed: Feb. 1, 1974

[21] Appl. No.: 438,837

[52] U.S. Cl. ............. 307/89; 317/101 CM; 333/12; 333/84 M

[51] Int. Cl.$^2$ ........................................... H04B 3/28

[58] Field of Search........ 333/12, 84 M; 307/89, 93, 307/102, 101 DH, 101 CP

[56] References Cited

UNITED STATES PATENTS

| | | | |
|---|---|---|---|
| 3,155,881 | 11/1961 | St. Jean | 317/101 CP |
| 3,300,686 | 1/1967 | Johnson et al. | 317/101 CM |
| 3,568,000 | 3/1971 | D'Abouille | 317/101 CM |
| 3,680,005 | 7/1972 | Jorgensen et al. | 317/101 CM |

*Primary Examiner*—Herman J. Hohauser
*Attorney, Agent, or Firm*—Sughrue, Rothwell, Mion, Zinn and Macpeak

[57] ABSTRACT

A technique for damping unwanted power system oscillations present in an integrated circuit package is disclosed. A very low d.c. impedance is achieved at any point in the voltage distribution system by a reduction in inductance, and increase in capacitance and an increase in a.c. resistance. The resistive voltage drop is achieved only at higher frequencies near the resonance frequency of the oscillations where it is needed. The scheme can be implemented on an integrated circuit chip by locating highly doped closed diffusion loops under the voltage supply lines or by placing metal layers on top of it. Further, a highly doped substrate has the same effect.

9 Claims, 12 Drawing Figures

VOLTAGE DISTRIBUTION SYSTEMS FOR INTEGRATED CIRCUITS

BACKGROUND OF THE INVENTION

1. Field of the Invention:

The present invention generally relates to voltage distribution systems for integrated circuits, and, more particularly, to a technique for damping unwanted power system transient oscillations due to the switching of high speed or high frequency integrated circuits or to prevent coupling over the voltage supply lines in integrated circuits.

2. Description of the Prior Art:

In a digital computer environment, integrated circuit chips are interconnected on cards or modules. It is anticipated that future technologies will involve cards of increasing complexity carrying an increasing number of chips. Signal lines as well as d.c. voltage lines are located on the surface of these cards. In some packages, internal signal and ground planes are introduced to increase wiring density and to introduce shielding. Such an arrangement is, however, more costly than a card with wiring on the surfaces only.

Also, capacitances from ground to the signal lines are increased by using internal planes, and transmission lines of relatively low impedance and low damping characteristics result. In a semiconductor memory environment, large transient currents may occur if a large number of circuits are switched simultaneously. This, in turn, introduces unwanted noise signals on the voltage supply lines. The voltage conductors must have low series d.c. resistance, since the conductors carry rather large d.c. currents and, therefore, they form relatively high Q resonance circuits. In this type of environment, the proper decoupling of the power system becomes difficult and expensive, especially for memory cards.

Standard techniques used to reduce the transient oscillations involve adding decoupling capacitors to the system. The capacitors themselves are not ideal and their leads add inductance to the circuit. Further, an optimum placement of the capacitors is often impossible due to topological restrictions. Also, the capacitors, in general, increase the Q of the resonance circuits which they form with the inductance of the conductors on the memory card. The noise reduction is only local since the rest of the system is still of a high reactance. Additionally, since a large number of large capacitors is required which must be placed at well specified locations, this approach is space consuming as well as expensive.

A second scheme which offers a solution only to part of the problem is disclosed in U.S. Pat. No. 3,189,847, to Rymaszewski et al. There, the voltage conductors are placed on a ferromagnetic ground plane having a conductivity inversely proportional to frequency. The ferromagnetic ground plane is separated from the conductors by a lossy dielectric, and its function may be described as analogous to a parallel resonant circuit. The inductances $L_s$ in the system are increased by the ferromagnetic material while a parallel loss mechanism $R_p$ is introduced by the lossy dielectric. The quality factor of the system is low since $L_s$ is large and $R_p$ is introduced by the dielectric material. While this scheme improves oscillatory behavior, the instability of the circuits and the interaction between circuits are much worse than in the original system. In addition, the supply voltage tolerance requirements are increased while the external noise immunity of the circuits is decreased. Further, the implementation of the scheme is rather elaborate and expensive.

U.S. Pat. No. 3,541,473 to Schlicke et al discloses a technique for the suppression of electro-magnetic interference in power conductors. The main purpose of the power transmitting conductors in this disclosure is to guide 60 Hz a.c. current with a high impedance $Z_o$ and also to filter out high frequency signals. This is in contrast to the requirements of voltage distribution systems for integrated circuits where a low impedance path must be achieved for transmitting d.c. current. The Schlicke et al scheme is implemented by employing a highly permeable layer around the conductors with gaps for saturation reasons. While this structure is effective to suppress radio frequency interference, this type of interference is a relative discrete spectrum of a few radio frequencies whereas the frequency spectrum of the pulses in a digital system is very wide.

SUMMARY OF THE INVENTION

A new technique is presented by this invention for the decoupling of the voltage supply lines on the "chip carrier" type cards. The technique introduces damping without the loss of d.c. power. Further, the general impedance level is reduced by this scheme due to a decrease in inductance and an increase in capacitance. The technique can be implemented in a variety of ways. Specifically, metal layers having predetermined thicknesses can be placed on top of the integrated circuit chip. Alternatively, highly doped closed diffusion loops can be located under the voltage supply lines, or a highly doped substrate can be used to the same effect. In any case, the result is to lower the quality factor of the power distribution lines and hence reduce the time for transients to die down and to reduce the initial amplitude of the transients.

BRIEF DESCRIPTION OF THE DRAWINGS

The specific nature of the invention as well as other objects, aspects, uses and advantages thereof, will clearly appear from the following description and from the accompanying drawings, in which.

DESCRIPTION OF THE PREFERRED EMBODIMENT

Figure 1:
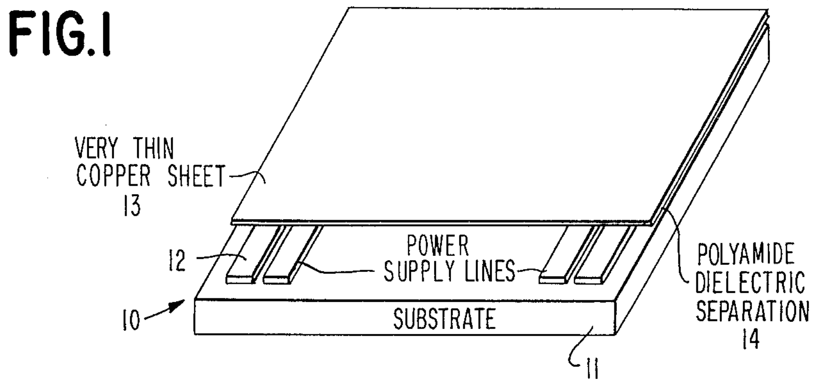
FIG. 1 is a generalized pictorial view illustrating a preferred embodiment of the invention.

Referring now to the drawings, and more particularly, to FIG. 1, the integrated circuit carrying card 10 is assumed to be laid out in such a way that all power supply lines 12 are located on the same side of the substrate 11. Signal lines (not shown) may also be on that side of the substrate 11, if necessary. To introduce damping, a thin lossy, non-connected conducting sheet 13 is located in close proximity to the power supply lines 12 as shown in FIG. 1. The lossy sheet 13 is electrically insulated from the power supply lines 12 by a very thin polyamide film 14.

The function of the lossy sheet 13 is threefold. First, the inductance is reduced considerably in a distributed way. Second, an a.c. series resistance is introduced which helps damp oscillations without loss of d.c. power. Third, capacitance is introduced uniformly at all points in the card 10. The capacitance is increased by an additional factor of two if the lossy sheet 13 is connected to the ground of the power supply system.

The lossy sheet 13 does not, however, change the inductance and loses of the loops formed in the power supply lines 12 via integrated circuit connections on the card 10. The flux is not coupled to the sheet 13 for these cases. Further, the lossy sheet 13 in conjunction with the supply lines 12 can act as a ground plane for signal lines which are located on the opposite side of the substrate 11. Ignorable series resistance is introduced in these lines due to the large spacing between them and the lossy sheet 13. Also, the capacitance of the signal lines can be kept rather low for an FET environment if the substrate 11 of the card 10 is sufficiently thick.

To extend the usefulness of this scheme, the lossy sheet 13 is not necessarily continuous; however, it is important that the lossy sheet 13 forms a closed loop and that the supply lines 12 to be damped are well covered by the lossy sheet 13.

A simple theory will be presented first for determination of the appropriate thickness for the lossy sheet 13. The impedance of a simple loop formed by power supply lines 12 is called $Z = R_1 + j\omega L_{11}$, while the new impedance with the lossy lossy sheet 13 present is called $Z'=R_1'+j\omega L_{11}'$. It should be noted that this theory is applicable only for sufficiently low frequencies where the capacitances are ignorable. For expedience only, a single secondary loop is taken to represent the lossy sheet 13, since the field is largest in the vicinity of the primary loop formed by the power supply lines 12. This is, in essence, the dominant part of the equivalent circuit. With this, the structure reduced to a transformer with the voltage/current relationship:

$$\begin{bmatrix} V_1 \\ V_2 \end{bmatrix} = \begin{bmatrix} (R_1 + sL_{11}) & sL_{12} \\ sL_{12} & (R_2 + sL_{22}) \end{bmatrix} \begin{bmatrix} I_1 \\ I_2 \end{bmatrix} \quad (1)$$

where $V_2$ is zero in the shorted "loop" in the lossy sheet 13, and $L_{12}$ and $L_{22}$ represent the mutual and self-inductances of the sheet loop.

The change in resistance in the primary loop formed by supply lines 12 due to the lossy sheet 13 is evaluated from Equation (1) as:

$$\Delta R = \frac{\omega^2 R_2 L_{12}^2}{R_2^2+\omega^2 L_{22}^2} \quad (2)$$

The new resistance in the primary loop formed by power supply lines 12 is then $R_1' = R_1 + \Delta R$. The secondary loop (in the lossy sheet 13) has an approximate width of $W_g = W+2d$, where W is the width of the supply line 12 forming the primary loop and d is the conductor 12 to sheet 13 spacing. For good conductors and sufficiently low frequencies, $R_2$ is small enough such that:

$$\Delta R = R_2 \frac{L_{12}^2}{L_{22}^2}$$

From Equation (2) it is easily found, by differentiating with respect to $R_2$, that for $R_2=\omega L_{22}$, the resistance induced into the primary loop formed by supply lines 12 is a maximum for the given frequency, $\omega$. Under these conditions, the new resistance in the primary loop is:

$$R' = R_1 + R_2 \frac{L_{12}^2}{2L_{22}^2} \quad (3)$$

for $$\omega = \frac{R_2}{L_{22}} \quad (4)$$

The designer, therefore, has two variables at hand to control the damping of switching transients in power supply lines 12. For one, the frequency $f=\omega/2\pi$ can be selected to be near the frequency of ringing. Then, the resistance of the secondary loop induced in lossy sheet 13, $R_2$, can be chosen to satisfy Equation (4) by selection of the appropriate thickness of the lossy sheet 13. $R_2$ is determined by the thickness and resistivity of the sheet 13 and by $W_g$ which was defined previously. A thin copper sheet 13 was used in all experiments.

As was mentioned earlier, the resistance induced in the primary looped formed by power supply lines 12 is non-dissipative for d.c. power. This is easily seen from Equation (2). If $\omega=0$ (d.c.), then $\Delta R=0$, so that at d.c. there is no resistance induced.

As with $\Delta R$, a $\Delta L$ can be computed from Equation (1):

$$\Delta L = -\frac{\omega^2 L_{12}^2 L_{22}}{R_2^2+\omega L_{22}^2} \quad (5)$$

This is the imaginary part of the input impedance of the primary loop which is induced by the secondary loop. For sufficiently large $\omega$ or $R_2 << \omega L_{22}$, this simplifies to:

$$\Delta L = -\frac{L_{12}^2}{L_{22}}$$

The inductance of the primary loop with the lossy sheet 13 is then $L_{11}' = L_{11} + \Delta L$, which is considerably less than the inductance without damping as will be shown.

Figure 2:
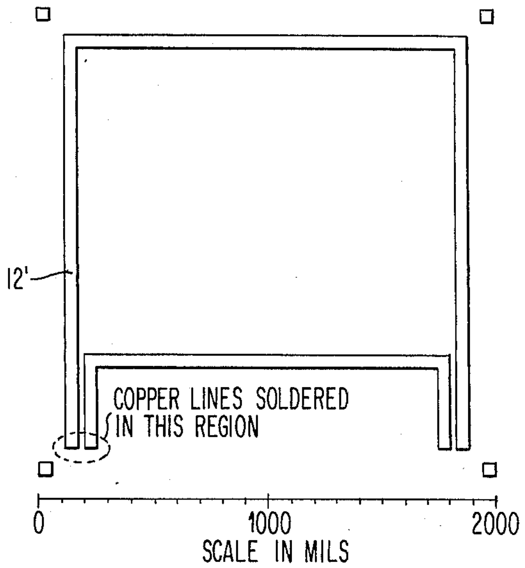
FIG. 2 is a plan view of a conductor loop on which impedance measurements were performed to confirm the theory of operation of the invention.

Impedance measurements were performed on the conductor loop 12' shown in FIG. 2. Conductor loop 12' simulates a primary loop formed by power supply lines 12. A vector impedance meter was used for the impedance measurements. The inductance of the primary loop is $L_{11}$=149nH without the damping of lossy sheet 13. If the lossy sheet 13 is spaced 0.4 mils above the loop 12 using a polyamide insulation 14 and the inductance of the secondary loop is approximately $$L_{22} \doteq L_{11},$$

then, for a maximum damped frequency of 5 MHz, a secondary resistance of $R_2$=4.7 ohms will be found. The actual sample used in the experiment had a 0.03 mil sheet thickness and a secondary loop resistance $R_2$=3.4 ohms. This yields maximum damping at $f$=3.7 MHz. Here, $\Delta R$=1.55 ohms which is eight times larger than the loop resistance $R_1$. $R_1$ of the primary loop is rather large for a power supply line.

The total capacitance between the loop 12' and the sheet 13 can be found by measurement or by a simple parallel plate formula to be $C_{12}$=.74nF.

Figure 3:
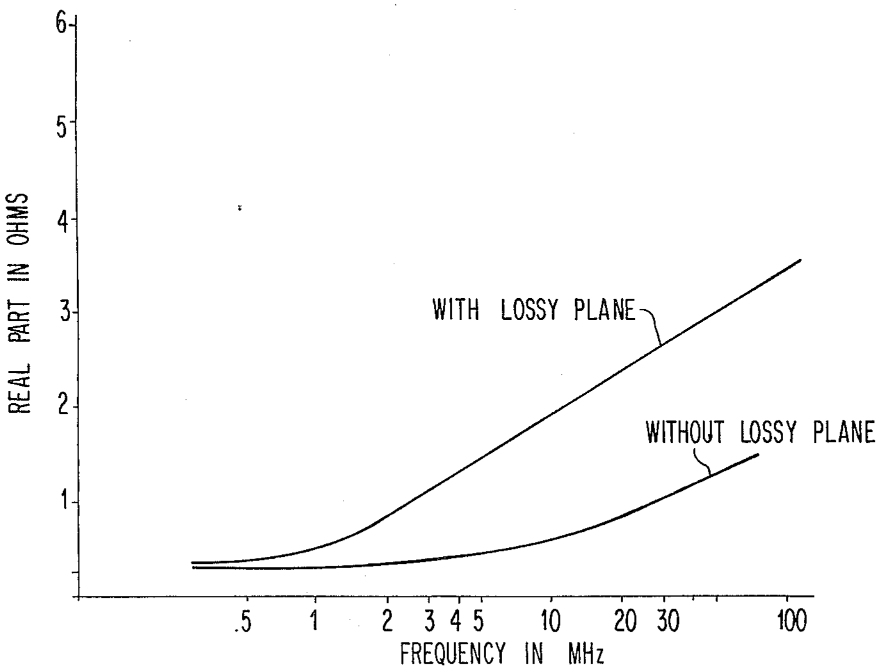
FIG. 3 is a graph of the resistive component of the impedance measured using the conductive loop shown in FIG. 2.
Figure 4:
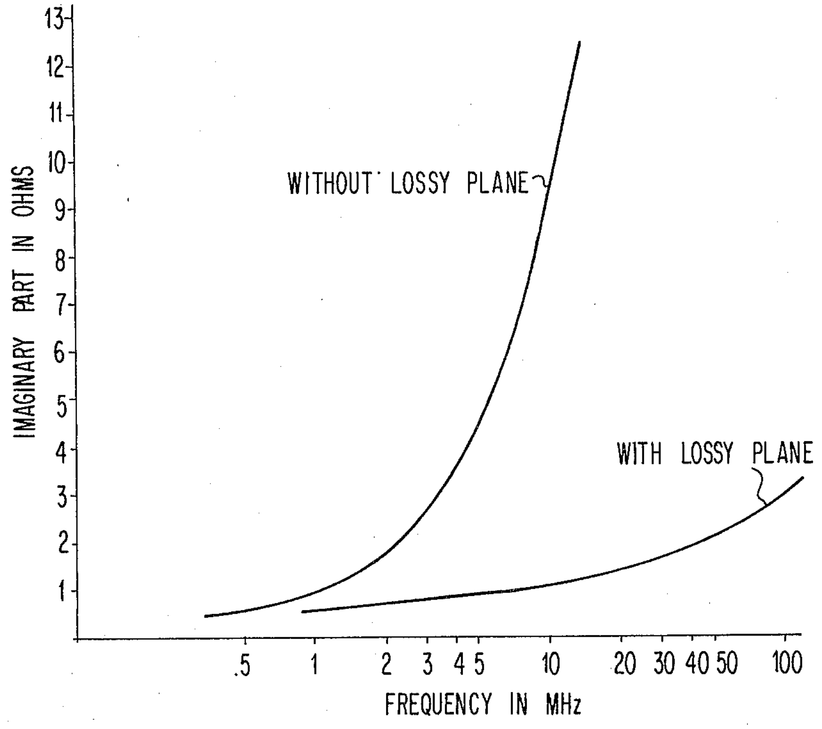
FIG. 4 is a graph of the inductive component of the impedance measured using the conductive loop shown in FIG. 2.

In FIG. 3, the resistive components are compared with and without the lossy sheet 13. Skin effect increases the resistance of the primary loop in the 100 MHz range as an additional source of damping. FIG. 4 shows a drastic decrease in the undesirable inductive component as a result of adding the lossy sheet 13.

Further, measurements were made on the system with the lossy sheet 13 having a 1.5 × 1.25 inch hole cut out of the center of the sheet in order to show the possibility of placing signal wires in the cut out area. The measured data with the cut out area coincides with the results given for the full sheet. Thus, placing signal lines into the hole is a good arrangement.

It should be noted here that if the lossy sheet 13 is assumed to form a transmission line with the voltage supply lines 12, the characteristic impedance of the system is less than 5 ohms.

For purposes of tests, pulse noise sources are considered, since, ultimately, the unwanted noise as a function of time of interest. In particular, a typical integrated circuit voltage distribution system shown in FIG. 5 was investigated. The copper lines 12 shown are located on a ceramic substrate 11.

Figure 5:
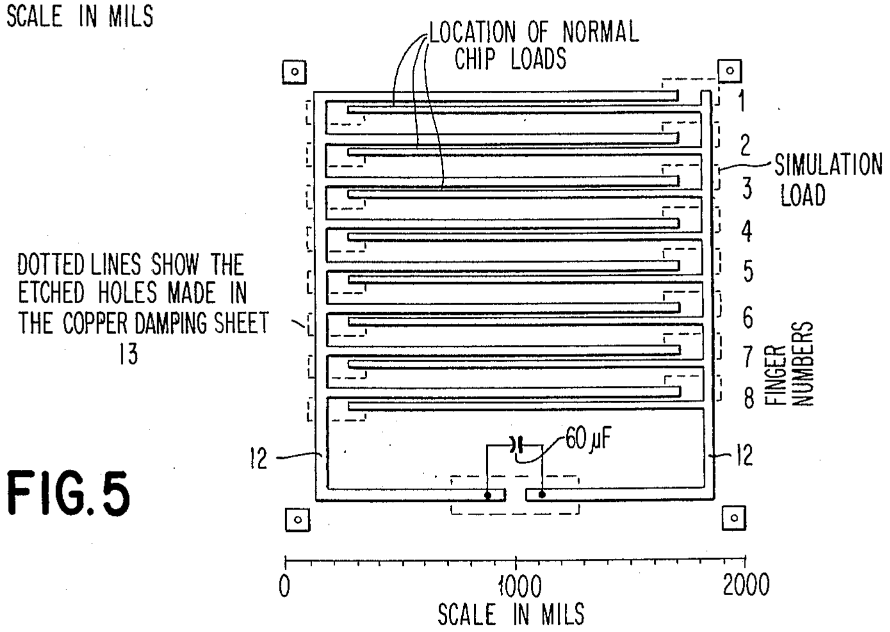
FIG. 5 is a plan view of a typical voltage distribution system used with integrated circuits.
Figure 6A:
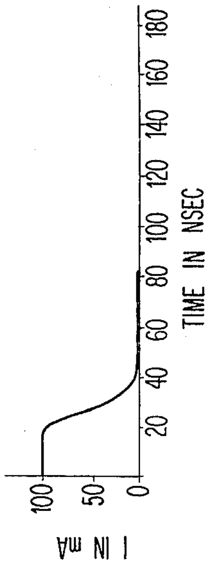
FIGS. 6*a*, 6*b* and 6*c* are graphs illustrating, respectively, a slow test pulse applied to the system shown in FIG. 5 and the voltage transients due to the test pulse without the invention and with the invention.

Usually, the integrated circuit loads are distributed between the fingers of the supply line 12 shown in FIG. 5. For simulation purposes, however, a single transistor circuit located at Finger 3 was used. All the transitions shown in FIGS. 6 and 7 are due to the turn off of the current source load, since in this mode less damping is introduced by the switching circuit itself. Responses with and without the lossy sheet 13 will be discussed.

Figure 6B:
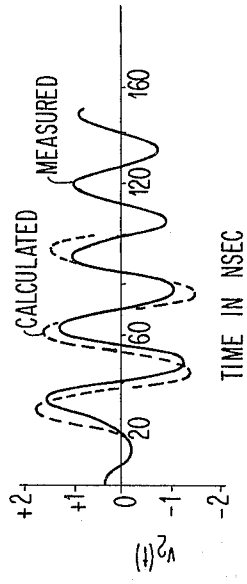

FIGS. 6 and 7 show source currents (a) and the system response to these currents (*b*, *c* and *d*). The case of FIG. 6 represents the slower pulses comparable to the transients in FET circuits, where FIG. 7 represents the typical bipolar circuits. The ringing at Finger 4 shown in FIG. 6*b* is measured with a 160 pF load placed across the probe. The transient from the circuit turning on has not completely decayed at the turn-off time shown here. The dotted line in FIG. 6*b* represents the calculated response from a simplified equivalent circuit. The predicted response is rather close to the measured response except for the skin effect damping in the actual circuit which was not included in the model.

Figure 6C:
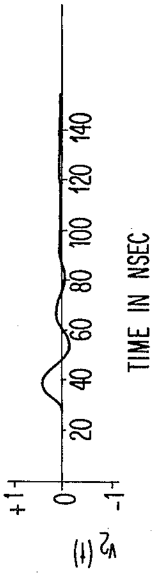

FIG. 6*c* shows the voltage $v_2(t)$ with a 0.05 mil copper damping sheet 13 added. The sheet 13 is electrically connected at a single point to the ground leg of the d.c. supply. Holes are etched out of the sheet 13 for the loads, as is indicated in FIG. 5. The thickness of the polyimide dielectric is approximately 0.4 mils. The amplitude of the noise is reduced by about a factor of four, and the oscillations in the noise voltage are for all practical purposes damped out within one period.

Figure 7A:
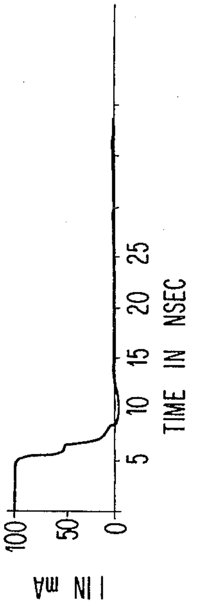
FIGS. 7*a*, 7*b*, 7*c* and 7*d* are graphs illustrating, respectively, a fast test pulse applied to the system shown in FIG. 5, the voltage transients due to the test pulse without the invention, with the invention, and using a decoupling capacitor by way of contrast.
Figure 7B:
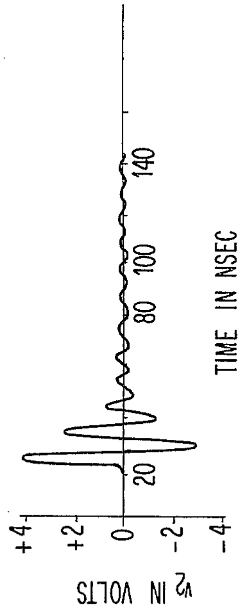

The response of the unloaded system without the damping sheet 13 is shown in FIG. 7*b*. The voltage oscillation is damped out fast due to the series resistance introduced by skin effect at 100 MHz. It should be noted that the response with the 160 pF load connectd is the same as for the slow pulse in FIG. 6*b*.

Figure 7C:
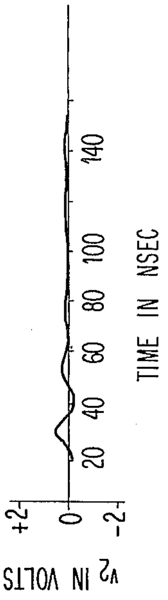
Figure 7D:
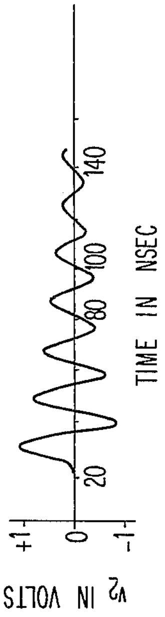

A further result of interest is shown in FIG. 7*d*. A 0.1 $\mu$F capacitor is connected across Finger 5 to block out the voltage $V_1$. Only one finger away, the voltage is again large as shown in FIG. 7*d*. This indicates that a large number of capacitors must be introduced to suppress the noise as well as the copper sheet does (FIG. 7*c*).

Numerous applications can be found for this technique. For example, different a.c. series resistances can be introduced into different voltage conductor loops if their frequency of ringing is different. Damping may also be restricted to a single loop only. Somewhat less related, damping loops may also help to decouple signal lines. Also, damping of power bus lines may be considered to reduce the transmission of noise generated in the power supply to the load. The technique has application, in general, where low impedance biasing networks are required for test setups.

The functions of the members must be as follows, for the system to work effectively:

The voltage supply necessary for this invention must be a low impedance type, a condition which is met by most modern voltage supplies. This is to maintain a low impedance throughout the system.

The integrated circuits which are assumed to be connected between the fingers shown in FIG. 5 are of the higher performance type. If circuits are switched in parallel as is the case in a semiconductor memory, currents up to 10 amps must be considered. Further, opposite to what has been assumed in the past, rise times of 1 nsec must be expected in the future event in FET systems. In general, circuits can be of the single frequency, logic or memory type.

The substrate 11 is not critical in practicing the invention. It can be ceramic or of a semiconductor material or not present at all. The only restriction is that the substrate be non-ferromagnetic.

In a typical wiring arrangement as shown in FIG. 5, the power supply lines 12 must be of a very low series resistance and of a non-ferromagnetic material. Examples are copper, aluminum or heavy doping in a semiconductor substrate.

The damping sheet 13, which may be a thin copper sheet insulated from the wires by a thin dielectric layer 14 as shown in FIG. 1, must be placed in close proximity to the loops formed by supply lines 12, but should not introduce any appreciable current leakage between the supply lines 12 having different voltages. The thickness of the copper sheet 13 must be tuned to give the maximum damping at the most desirable frequency. In a multiple loop environment, a variable thickness may be desirable to tune the sheet 13 to several loops having different resonance frequencies. This is readily done by selective etching of the copper sheet 13. It is desirable for the separating dielectric layer 14 to have a high permittivity for an increase in capacitance.

Another implementation of the invention is a set of diffused closed loops in a semiconductor substrate 11 under the power supply lines 12, or still another alternative is the use of a highly doped semiconductor substrate 11 to form the damping layer.

It will be apparent that the embodiment shown is only exemplary and that various modifications can be made in construction and arrangement within the scope of the invention as defined in the appended claims.

We claim:

1. A method of damping unwanted power system transient oscillations due to the switching of high speed and high frequency integrated circuits in an integrated circuit package comprising the step of providing a non-ferromagnetic, conductive layer forming a closed loop in close proximity to the wire loops in the power distribution system.

2. A method of damping as recited in claim 1 further comprising the step of tuning said layer by varying its thickness to give the maximum damping at the most desirable frequency.

3. In an integrated circuit power distribution system of the type wherein wires on a substrate have a very low series resistance and are connected to supply d.c. voltage to high performance integrated circuits, said wires forming loops and being adapted to be connected to a low impedance voltage supply, the improvement comprising a non-ferromagnetic, conductive layer forming a closed loop in close proximity to said wire loops but electrically insulated therefrom, said conductive layer being sufficiently close to said wire loops to reduce the inductance of said wires, increase the a.c. series resistance in said wires and introduce capacitance uniformly in the system thereby damping unwanted transient oscillations which may occur in said power distribution system due to the switching of said integrated circuits.

4. The improvement as defined in claim 3 wherein said conductive layer is a thin metallic sheet separated from said wires by a thin dielectric layer.

5. The improvement as defined in claim 4 wherein said metallic sheet is copper.

6. The improvement as defined in claim 4 wherein said metallic sheet is aluminum.

7. The improvement as defined in claim 3 wherein said conductive layer is a set of diffused closed loops in a semiconductor substrate under said wires.

8. The improvement as defined in claim 3 wherein said conductive layer is a highly doped semiconductor substrate under said wires.

9. The improvement as defined in claim 3 wherein the thickness of said conductive layer is predetermined to tune said layer to give the maximum damping at the most desirable frequency.

* * * * *